US007780469B2

(12) United States Patent
Zschieschang et al.

(10) Patent No.: US 7,780,469 B2
(45) Date of Patent: Aug. 24, 2010

(54) ARRANGEMENT OF AT LEAST ONE POWER SEMICONDUCTOR MODULE AND A PRINTED CIRCUIT BOARD

(75) Inventors: Olaf Zschieschang, Viernheim (DE); Andreas Laschek-Enders, Bensheim (DE)

(73) Assignee: IXYS CH GmbH, Lampertheim (DE)

( * ) Notice: Subject to any disclaimer, the term of this patent is extended or adjusted under 35 U.S.C. 154(b) by 0 days.

(21) Appl. No.: 12/055,848

(22) Filed: Mar. 26, 2008

(65) Prior Publication Data
US 2008/0293261 A1 Nov. 27, 2008

(30) Foreign Application Priority Data
Mar. 28, 2007 (DE) .................. 10 2007 014 789

(51) Int. Cl.
*H01R 13/00* (2006.01)
(52) U.S. Cl. .................. 439/485; 439/487; 361/704; 361/709; 361/710; 361/719
(58) Field of Classification Search ............. 439/485, 439/487; 361/704, 709, 710, 719
See application file for complete search history.

(56) References Cited

U.S. PATENT DOCUMENTS

| 4,521,829 A | * | 6/1985 | Wessely ..................... 361/705 |
| 4,750,089 A | * | 6/1988 | Derryberry et al. .......... 361/712 |
| 5,184,211 A | * | 2/1993 | Fox ............................. 257/706 |
| 5,396,404 A | * | 3/1995 | Murphy et al. ............... 361/719 |
| 5,483,103 A | | 1/1996 | Blickhan et al. |
| 5,504,653 A | * | 4/1996 | Murphy et al. ............... 361/704 |
| 5,548,487 A | * | 8/1996 | Brabetz et al. .............. 361/769 |
| 5,648,889 A | | 7/1997 | Bosli |
| 5,767,573 A | | 6/1998 | Noda et al. |
| 5,889,652 A | * | 3/1999 | Turturro ..................... 361/705 |
| 6,035,523 A | | 3/2000 | McNeil et al. |
| 6,180,436 B1 | | 1/2001 | Koors et al. |
| 6,404,065 B1 | | 6/2002 | Choi |
| 6,566,879 B1 | | 5/2003 | Vanek et al. |
| 6,631,078 B2 | * | 10/2003 | Alcoe et al. ................. 361/719 |
| 6,633,485 B1 | | 10/2003 | Sigl et al. |

(Continued)

FOREIGN PATENT DOCUMENTS

DE 19625240 A1 4/1997

(Continued)

*Primary Examiner*—Tho D Ta
(74) *Attorney, Agent, or Firm*—Connolly Bove Lodge & Hutz LLP

(57) ABSTRACT

An arrangement between a power semiconductor module and a printed circuit board is disclosed, A printed circuit board includes strip conductors, and a power semiconductor module includes a module housing and power terminals. The power terminals extend to the exterior of the module housing and into contact with the strip conductors. A heat sink is disposed on a side of the power semiconductor module opposite the circuit board. A deformable means is disposed between the module housing and the circuit board and is configured to relieve a contact pressure load on the power terminals. A contact-pressure element is disposed on a side of the circuit board opposite the power semiconductor module. The contact-pressure element is integral with a first housing part of an arrangement housing, and the heat sink is integral with a second housing part of the arrangement housing. The two housing parts enclose the circuit board.

25 Claims, 2 Drawing Sheets

| U.S. PATENT DOCUMENTS | | | |
|---|---|---|---|
| 7,023,699 B2 * | 4/2006 | Glovatsky et al. | 361/704 |
| 2006/0138452 A1 | 6/2006 | Knapp et al. | |

FOREIGN PATENT DOCUMENTS

| DE | 19646396 | 5/1998 |
|---|---|---|
| EP | 0513410 A1 | 11/1992 |
| WO | WO-94/29901 A1 | 12/1994 |

\* cited by examiner

ARRANGEMENT OF AT LEAST ONE POWER SEMICONDUCTOR MODULE AND A PRINTED CIRCUIT BOARD

BACKGROUND OF THE INVENTION

1. Priority

Priority is claimed to German Patent Application No. DE 102007014789.0-33, filed Mar. 28, 2007, the disclosure of which is incorporated herein by reference in its entirety.

2. Field of the Invention

The invention relates to an arrangement of at least one power semiconductor module and a printed circuit board as well as a power semiconductor module.

3. Background

Arrangements between semiconductor modules and printed circuit boards can be found in various areas of electrical engineering, for example in a drive control device for an electric motor. The circuit arrangement of such a drive control device comprises various function blocks, for example rectifiers, inverters and braking controllers. These function blocks are formed by power semiconductor components and/or power semiconductor modules, the latter being able to contain all the necessary power semiconductors and in addition further components, for example components for monitoring the power semiconductors, which can comprise for example temperature and/or current sensors. The power semiconductor components and/or power semiconductor modules are usually disposed on a printed circuit board and are connected by screwing, plugging or soldering to the latter.

There are known from EP 0 513 410 B1 and DE 196 46 396 C2 power semiconductor modules which in each case comprise an electrically insulating substrate, on which a circuit arrangement with power semiconductor components is disposed. The substrate forms the bottom of a plastic housing which surrounds the circuit arrangement. The electrical power terminals of the modules making contact with the circuit arrangement extend through the housing to the exterior. The housing is filled with casting compound in order to protect the circuit arrangement. Fastening points on the housing are used for screwing the module to a heat sink. Various modules are connected to one another by means of conductor bars in order to create a more extensive circuit. Such a bar connection is made in a second plane at a distance from the heat sink, in order to ensure sufficient air gaps and creepage distances for the purpose of electrical insulation. Following in the same plane or above the latter are wiring devices and an electronic printed circuit board, for example for controlling the power semiconductor components or for their monitoring.

This known design of power semiconductor components and/or power semiconductor modules including protection devices and control electronics requires a high outlay on materials and on numerous intermediate steps and screwing, soldering and assembly steps in production. Furthermore, the heat generation caused by the power loss during the operation of the power semiconductor modules is usually concentrated on relatively small areas. This heat generation can reduce the power of the overall system and the reliability of the power semiconductor modules. A fairly large outlay on the cooling of these power semiconductor modules is therefore required.

Alternatively, so-called discrete power semiconductor components are for example used in suitable built-on accessories. As a rule, these represent individual functions in one housing in each case. Power semiconductors are soldered here directly onto a metallic carrier plate and enclosed for protection. These components can be distributed spatially in the electronic power arrangement, so that a better distribution of the heat is achieved in the heat sink and, in that case, the outlay on implementing adequate cooling can be reduced. They are characterised by a mechanically robust design and, as a result of large unit quantities, are available at low cost as elements for the most varied circuit functions in standardised designs. The drawback is that the carrier plate, which serves to dissipate heat, is not electrically insulated from the power semiconductor and thus carries an electrical potential. For the assembly of such discrete power semiconductor components on a common heat sink, therefore, additional insulation is required which, however, has a markedly unfavourable effect on the heat discharge to the heat sink. As a rule, these components are fastened on the heat sink by means of a screw or clamp assembly, which requires additional assembly parts, such as small insulation plates and/or heat conducting materials, screws, assembly clamps and corresponding assembly outlay. Furthermore, it is as a rule necessary to accept limitations with regard to the soldering process. On account of the lack of insulation, components are used which in their dimensions and other properties are comparable with the described components, but with which a solid metallic carrier plate is not used, but rather use is made of a ceramic base plate metal-coated on both sides. Such components are described for example in DE 196 25 240 B4 and U.S. Pat. No. 6,404,065. Nonetheless, additional assembly parts and special assembly steps are also required here for the assembly on the heat sink and where necessary, for the soldering into the printed circuit board.

The terminal combs of components used for the electrical contracting are as a rule led out flat towards the sides. For many applications, therefore, there is the problem of maintaining the air gaps and creepage distances between the terminals with the various voltage potentials on the one hand and between the terminals and the metal-coated carrier plate or heat sink in the application on the other hand.

WO94/29901 describes an arrangement which comprises a printed circuit board with strip conductors, semiconductor components disposed on the printed circuit board and making contact with the strip conductors and a heat sink. The printed circuit board is screwed to one leg of the T-shaped heat sink. Disposed between the heat sink and the printed circuit board is a spring element, which comprises two lateral spring tongues which are intended to press the semiconductors against the heat sink as a result of their bending and pre-tensioning.

There is known from U.S. Pat. No. 6,035,523 A an arrangement comprising a printed circuit board, a semiconductor module and a heat sink, wherein a thermoplastic material is introduced between the semiconductor component and the printed circuit board, said thermoplastic material being intended to carry the semiconductor components.

SUMMARY OF THE INVENTION

The present invention is directed toward an arrangement of at least one power semiconductor module and a printed circuit board with strip conductors. The power semiconductor module includes a housing with power terminals, which extend through the housing to the exterior and make contact with the strip conductors of the printed circuit board.

The arrangement is characterised in that elastically or plastically deformable means are disposed between the housing of the power semiconductor module and the printed circuit board, via which means a contact pressure can be transferred from the printed circuit board to the housing. The load on the power terminals of the power semiconductor module is thus relieved. There is therefore no risk of bending of the terminal elements. Moreover, a predetermined distance between the terminal elements and the metal coating of the printed circuit board is maintained. It is advantageous if the elastically or plastically deformable means are made from a heat-conducting material.

Moreover, the arrangement includes at least one contact-pressure element, which is disposed at the side of the printed circuit board facing away from the power semiconductor module, and at least one heat sink, which is disposed at the side of the power semiconductor module facing away from the printed circuit board. The contact-pressure element is embodied in one piece with a first housing part of a housing, whilst the heat sink is embodied in one piece with a second housing part of the housing. The two housing parts enclose the printed circuit board together with the electronic components provided on the printed circuit board.

Elastically or plastically deformable means are understood to mean materials and/or structures which relieve the load on the power terminals when a contact pressure is exerted on the printed circuit board of the arrangement. Preferably, the means are elastically deformable, so that they can exert a restoring force. In principle, however, it is also possible for the means to be plastically deformable, so that the printed circuit board rests on the plastically deformable means, but not on the terminal elements.

In a preferred embodiment, the elastically or plastically deformable means are embodied as at least one spring element, which is deformed in such a way that the spring element comprises at least one outwardly arched area for the seating of the printed circuit board, the seating area giving way in a spring-like manner under pressure. The spring element is placed preferably in a clamped manner onto the housing of the power semiconductor module. For this purpose, the spring element can comprise clamps which engage laterally over the housing. The spring element is preferably made of metal, for example a spring steel. The spring element may also be a metal clamp which is bent outwards.

An alternative embodiment makes provision such that the elastically or plastically deformable means are embodied as at least one elastically or plastically deformable cushion between a power semiconductor module and a printed circuit board. The elastically or plastically deformable cushion can be fastened to the surface of the housing of the power semiconductor module or be inserted into a cut-out or recess of the housing. The cushion is preferably glued to the housing of the power semiconductor module. The cushion can however also be formed by the fact that the arrangement of the power semiconductor module, after the soldering with a printed circuit board, is cast by means of an elastically deformable and electrically insulating compound, for example silicone rubber.

The elastically or plastically deformable cushion can be made from different materials which have plastic and/or elastic and preferably electrically insulating properties. The decisive factor is that the cushion absorbs the force exerted by the contact-pressure element on the housing of the power semiconductor module and thus permanently presses the housing against a cooling plate for improved thermal coupling. The load on the electrical terminal elements of the power semiconductor module is thereby also relieved. In addition, the electrically insulating cushion helps ensure the maintenance of the insulation distances for air gaps and creepage distances between the electrical terminals and the printed circuit board which are required for the electrical operation. Moreover, the cushion together with the power terminals can compensate for temperature-related deformations of the power semiconductor module, which can be traced back to the different thermal expansion coefficients of the materials contained in the power semiconductor module.

The at least one power semiconductor module preferably comprises a carrier plate made of insulating ceramic substrate, which forms the bottom of the housing. The carrier plate is provided on one side with a metal layer structured corresponding to a circuit arrangement of the power semiconductor module and on the side opposite this side, i.e. the outer side, with a continuous metal layer which is used for the thermal coupling of the power semiconductor module to a heat sink. At least one power semiconductor component is disposed on the structured metal layer and is soldered to the latter at the underside and makes contact with the latter at the upper side by means of electrical connection elements which are preferably embodied as bond wires.

The elastically or plastically deformable means can also be disposed between the contact-pressure element and the printed circuit board, on the side of the printed circuit board facing away from the power semiconductor module, in order to compensate for a gap, caused by component tolerances, between the printed circuit board and the contact-pressure element. Irrespective of the component tolerances, the contact-pressure element is constructed to exert a sufficiently great force on the printed circuit board.

Accordingly, an improved arrangement between a power semiconductor module and a printed circuit board is disclosed. Advantages of the improvements will appear from the drawings and the description of the preferred embodiment.

BRIEF DESCRIPTION OF THE DRAWINGS

The invention will be explained in greater detail below by reference to the embodiments illustrated in the figures. In the figures, wherein the same reference numbers refer to similar components.

DETAILED DESCRIPTION OF THE PREFERRED EMBODIMENTS

Figure 1:
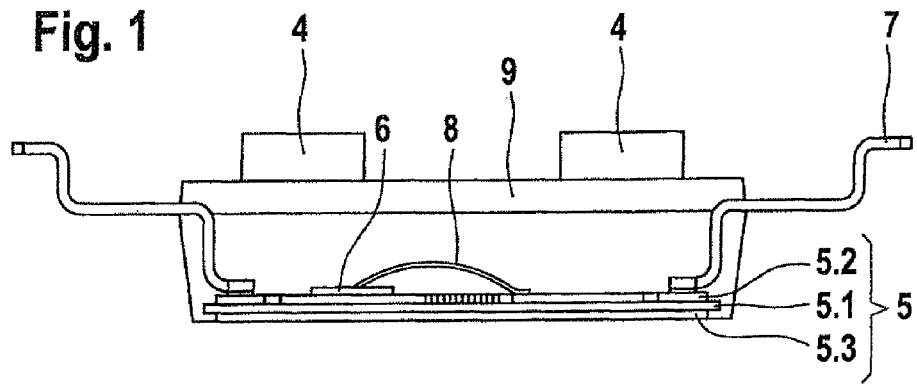
FIG. 1 shows a first embodiment of the power semiconductor module.

Turning in detail to the drawings, FIG. 1 illustrates a power semiconductor module 1 which includes a housing 9, preferably produced from an epoxy compound, and a carrier plate 5 having an insulating ceramic substrate, the carrier plate 5 forming the bottom of the housing 9. Optionally, the housing 9 and the carrier plate 5 can also be produced from metal. The carrier plate 5 includes metal layers 5.2, 5.3 both on its side facing housing 9 and on its side facing away from housing 9, i.e. the outer side, with the first metal layer 5.2 being structured corresponding to the strip conductors of a circuit arrangement. A power semiconductor component 6 is disposed on this structured metal layer 5.2 and soldered to the latter at the underside. At the upper side, the power semiconductor component 6 is in contact with strip conductors of the structured metal layer 5.2, preferably by means of bond wires 8, the bond wires 8 being soldered respectively to the power semiconductor component 6 and the strip conductor. Two power terminals 7, preferably designed to be bracket-shaped, form the electrical terminals of the power semiconductor module 1, which are soldered at their ends inside the housing 9 in each case to a strip conductor of the circuit arrangement and in each case extend through the housing 9, preferably laterally to the exterior. The two outer ends of the power terminals 7 are embodied as terminals of a surface-mounted component or SMD component (Surface-Mounted Device) with solderable contact areas. In principle, the electrical terminals 7 of the power semiconductor module 1 do not have to be embodied as SMD components. On the contrary, the latter can be screwed to the printed circuit board 3, on which the power semiconductor module is placed, or can be inserted therein.

In order to maintain the insulation distances for air gaps and creepage distances between the sections of the electrical terminals 7 lying inside the housing 9 and the carrier plate 5, and between the sections of the electrical terminals 7 lying outside the housing 9 and the printed circuit board 3 as well as a heat sink 11, said insulation distances being required for the electrical operation, the power terminals 7 are embodied in such a way that the terminals 7 inside the housing 9 first extend essentially vertically from the carrier plate 5, then laterally through the housing 9 to the exterior and then essentially vertically to the printed circuit board 3.

Figure 2:
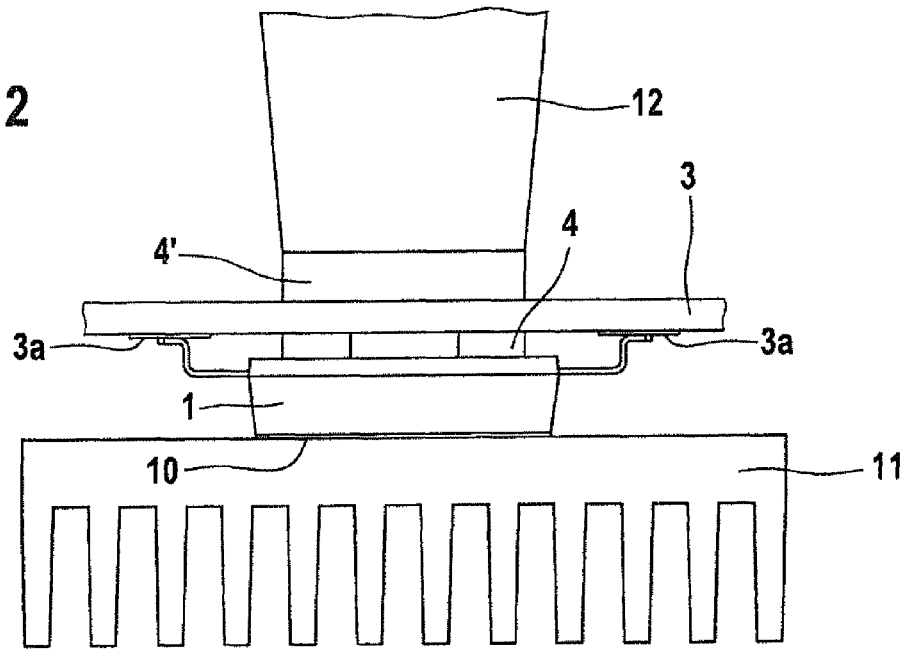
FIG. 2 shows an arrangement comprising the power semiconductor module from FIG. 1 and a printed circuit board.

The housing 9 comprises, on an outer side facing away from the carrier plate 5, two cushions 4 spaced apart from one another and made from an elastically and/or plastically deformable material, which serves to support the printed circuit board 3 during pressing of the housing 9 against the heat sink 11 by means of a contact-pressure element 12. Two recesses can be provided at the outer side of the housing 9, in which recesses the two cushions 4 sit. The two cushions 4 in each case are provided on the module side with an adhesive layer and glued to the outer side of the housing 9. As early as the production of the power semiconductor module 1, the cushions 4 can be glued to its housing, which simplifies the assembly of such an arrangement. In FIG. 2, the power semiconductor module 1 is soldered to the strip conductors 3a of the printed circuit board 3 in such a way that both cushions 4 are disposed between the housing 9 of the power semiconductor module 1 and the printed circuit board 3. The contact-pressure element 12, which is disposed at a side of the printed circuit board 3 facing away from the power semiconductor module 1, presses the printed circuit board 3 against both cushions 4 and thus the power semiconductor module 1 against the heat sink 11, the outer side of the carrier plate 5 being adjacent to the heat sink 11. A heat-conducting paste located between the metallic outer side of the carrier plate 5 and the heat sink 11 contributes to the improvement in the thermal conductivity.

Both cushions 4 absorb the forces exerted by the contact-pressure element 12 on the housing 9 of the power semiconductor module 1 and thus relieve the load on the electrical terminals 7 of the power semiconductor module 1. The deformation of the electrical terminals 7 is thus prevented, so that the power semiconductor module 1 remains spaced apart from the printed circuit board 3. Consequently, the cushions 4 help ensure the maintenance of the insulation distances for air gaps and creepage distances between the electrical terminals 7 and the printed circuit board 3 required for the electrical operation. Moreover, the cushions 4 together with the power terminals 7 compensate for temperature-related deformations of the power semiconductor module 1, which can be traced back to the different thermal expansion coefficients of the materials contained in the power semiconductor module 1.

An additional cushion 4' made from an elastic and/or plastic material can be disposed between the contact-pressure element 12 and the printed circuit board, the additional cushion being able to compensate for a gap, caused by component tolerances, between the printed circuit board 3 and the contact-pressure element 12, so that the contact-pressure element 12 exerts a sufficiently great force on the printed circuit board 3. An additional cushion between the contact-pressure element and the printed circuit board is not however generally necessary in the case of the component tolerances present in practice.

Figure 3:
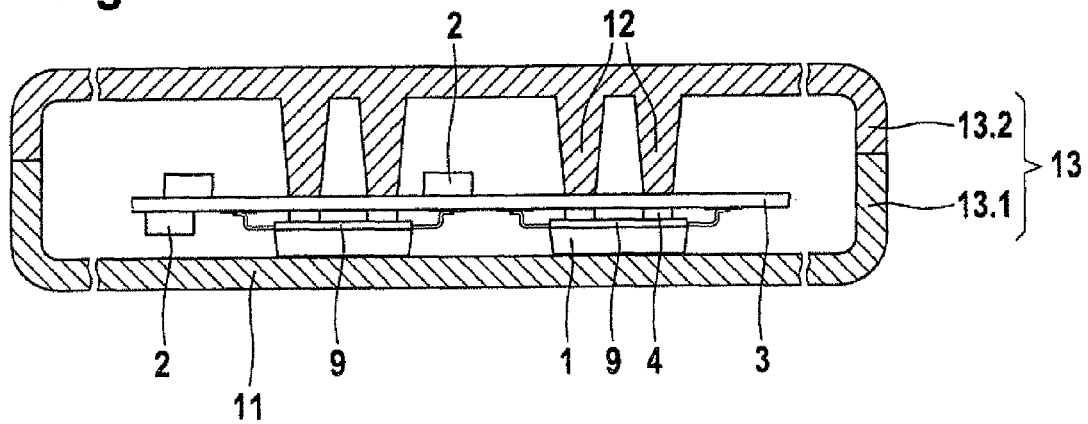
FIG. 3 shows an alternative embodiment of the arrangement with the power semiconductor module from FIG. 1.

FIG. 3 shows an alternative embodiment of the arrangement, wherein the contact-pressure element 12 is embodied in one piece with a first housing part 13.2, which forms the top of a housing 13 made of metal, preferably for example of cast iron, whilst the heat sink 11 is embodied in one piece with a second housing part 13.1 of the housing 13. The two housing parts 13.1, 13.2 enclose the printed circuit board 3 together with the electronic components 1, 2 provided on the printed circuit board. In contrast with the arrangement according to FIG. 2, a separate contact-pressure element 12 is here provided for each cushion 4 in this arrangement.

Figure 4:
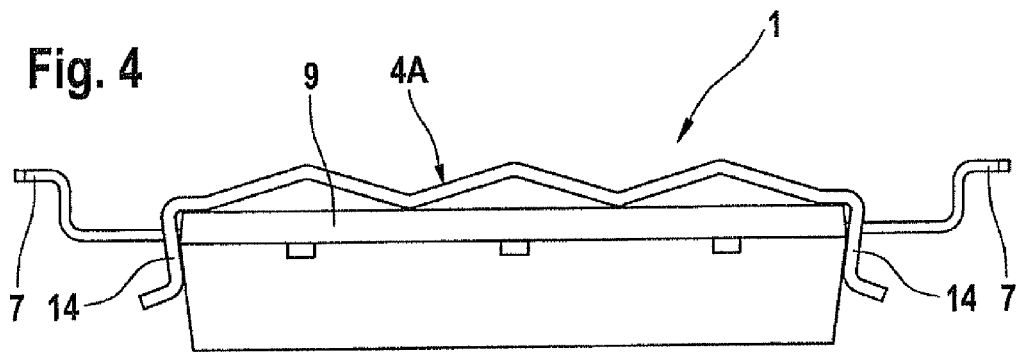
FIG. 4 shows a second embodiment of the power semiconductor module.

FIG. 4 shows an alternative embodiment of the power semiconductor module. This embodiment differs from the embodiment of FIG. 1 by the fact that a spring element 4A is provided instead of a cushion. The spring element 4A is a thin plate made of spring steel, which is zigzag-shaped and bent down laterally at its edges. The two edges of the spring element bent down laterally form clamps 14, which laterally engage around the housing of the power semiconductor module and secure the spring element to the housing. The thin plate made of spring steel is deformed in such a way that the plate can be compressed when a contact pressure is exerted on the plate from above. Since the two clamps 14 are easily bent inwards, a sufficient clamp tension is also achieved when the spring element is pressed on the housing.

Figure 5:
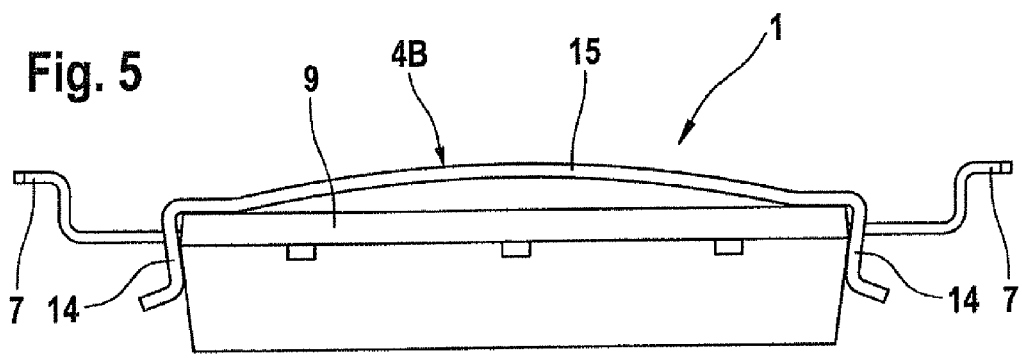
FIG. 5 shows a further embodiment of the power semiconductor module.

FIG. 5 shows yet another alternative embodiment with a different spring element. Spring element 4B of FIG. 5 is a thin plate of spring steel which is bent down at its edges. The thin plate is arched outwards between the two edges, which again act as clamps 14 for fastening the spring element to the housing. An outwardly arched seating area 15 is thus created for the printed circuit board, which gives way under the compressive stress.

Spring elements 4A, 4B of FIG. 4 and FIG. 5 can also be produced cost-effectively from a flexible elastically deformable plastic, for example as an injection moulded part in large piece numbers. They can have a zigzag-shaped zone or an outwardly arched zone or also a plurality of sections in each case with a zigzag-shaped or outwardly arched zone.

Figure 6:
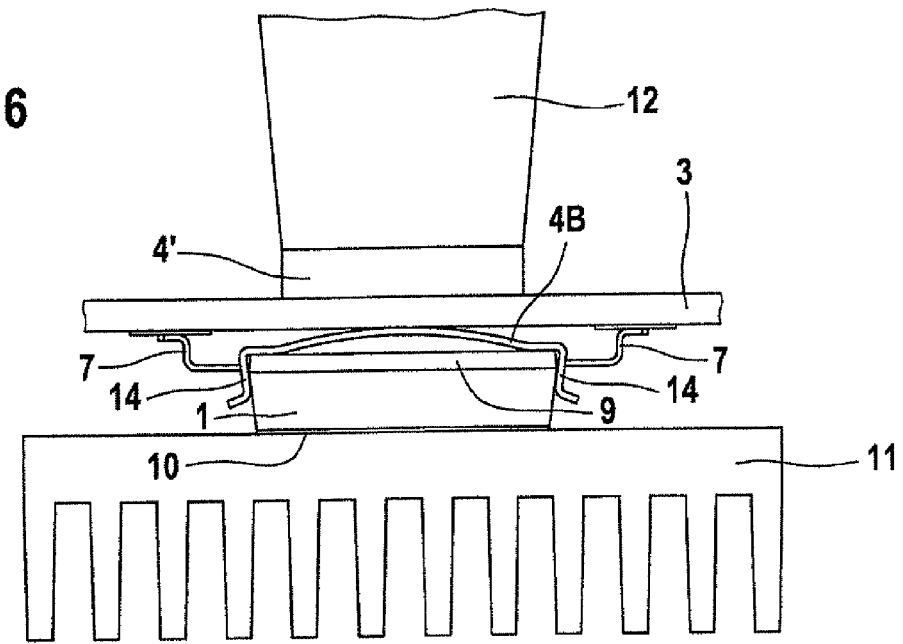
FIG. 6 shows an arrangement comprising the power semiconductor module from FIG. 5 and a printed circuit board.

FIG. 6 shows the spring elements 4B disposed between the printed circuit boards and the housing 9 of the power semiconductor module 1. The printed circuit board 3 rests on the outwardly arched seating area 15 of the spring element 4B. Such an arrangement can incorporate any power semiconductor module, such as the one shown in FIG. 4, or any other.

Thus, an arrangement between a power semiconductor module and a printed circuit board is disclosed. While embodiments of this invention have been shown and described, it will be apparent to those skilled in the art that many more modifications are possible without departing from the inventive concepts herein. The invention, therefore, is not to be restricted except in the spirit of the following claims.

What is claimed is:

1. An arrangement comprising:
a printed circuit board having strip conductors;

a power semiconductor module including a module housing and power terminals which extend to the exterior of the module housing and into contact with the strip conductors;

a heat sink disposed on a side of the power semiconductor module opposite the printed circuit board;

elastically or plastically deformable means being disposed between the module housing and the printed circuit board and being in contact with the module housing and the printed circuit board, the deformable means being configured to relieve a contact pressure load on the power terminals by transferring the load from the printed circuit board to the module housing, wherein the deformable means include at least one spring element comprising at least one outwardly arched area on which the printed circuit board is seated, the outwardly arched area being adapted to give way in a spring-like manner under pressure, and the spring element comprises clamps adapted to engage the module housing; and at least one contact-pressure element disposed on a side of the printed circuit board opposite the power semiconductor module configured to apply pressure on the printed circuit board, wherein the contact-pressure element is integral with a first housing part of an arrangement housing, and the heat sink is integral with a second housing part of the arrangement housing, the two housing parts enclosing the printed circuit board.

2. The arrangement according to claim 1, wherein the spring element is placed in a clamped manner onto the module housing.

3. The arrangement according to claim 1, wherein the spring element is made of metal.

4. The arrangement according to claim 1, the power semiconductor module comprising:

a carrier plate made of insulating ceramic, the carrier plate forming the bottom of the housing of the power semiconductor module and including a metal layer structured as a circuit arrangement; and at least one power semiconductor component disposed on and soldered to an underside of the structured metal layer of the carrier plate, wherein electrical connection elements extend from the power semiconductor component to contact an upper side of the structured metal layer.

5. The arrangement according to claim 1, wherein power terminals of the power semiconductor module are configured as surface mountable terminals and include a section extending laterally to the exterior through the module housing, which is followed by a section running essentially normal thereto.

6. The arrangement according to claim 1, wherein the module housing is made from an epoxy compound.

7. The arrangement according to claim 1, wherein the module housing is a metal housing.

8. A power semiconductor module comprising:
a housing;
power terminals extending through the housing to the exterior, wherein the power terminals are in contact with strip conductors of a printed circuit board
elastically or plastically deformable means being disposed at a side of the housing facing the printed circuit board during the assembly of the power semiconductor module, such that a contact pressure can be transferred from the printed circuit board to the housing, via the deformable means, thereby relieving a load on the power terminals, wherein the elastically or plastically deformable means includes at least one spring element having at least one outwardly arched area for seating a printed circuit board, the outwardly arched area giving way in a spring-like manner under pressure, and wherein the spring element is placed in a clamped manner onto the housing.

9. The semiconductor module according to claim 8, wherein the spring element comprises clamps engaging laterally over the housing.

10. The semiconductor module according to claim 8, wherein the spring element is made of metal.

11. The semiconductor module according to claim 8, further comprising
a carrier plate made of insulating ceramic, the carrier plate forming a bottom of the housing and including a metal layer structured as a circuit arrangement; and
at least one power semiconductor component disposed on and soldered to an underside of the structured metal layer of the carrier plate, wherein electrical connection elements extend from the power semiconductor component to contact an upper side of the structured metal layer.

12. The semiconductor module according to claim 8, wherein the power terminals are configured as surface mountable terminals and include a section extending laterally to the exterior through the housing, which is followed by a section running essentially normal thereto.

13. The semiconductor module according to claim 8, wherein the housing is made of an epoxy compound.

14. The semiconductor module according to claim 8, wherein the housing is a metal housing.

15. An arrangement comprising:
a printed circuit board having strip conductors;
a power semiconductor module including a module housing and power terminals which extend to the exterior of the module housing and into contact with the strip conductors;
elastically or plastically deformable means being disposed between the module housing and the printed circuit board and being in contact with the module housing and the printed circuit board, the deformable means being configured to relieve a contact pressure load on the power terminals by transferring the load from the printed circuit board to the module housing;
a housing having a first housing part and a second housing part, the two housing parts enclosing the printed circuit board, wherein the first housing part includes at least one contact-pressure element extending to a side of the printed circuit board opposite the power semiconductor module, the contact-pressure element being configured to apply pressure on the printed circuit board directly opposite the power semiconductor module, and the second housing part is in contact with the module housing and includes a heat sink.

16. The arrangement according to claim 15, the power semiconductor module comprising:
a carrier plate made of insulating ceramic, the carrier plate forming the bottom of the housing of the power semiconductor module and including a metal layer structured as a circuit arrangement; and
at least one power semiconductor component disposed on and soldered to an underside of the structured metal layer of the carrier plate, wherein electrical connection elements extend from the power semiconductor component to contact an upper side of the structured metal layer.

17. The arrangement according to claim 15, wherein power terminals of the power semiconductor module are configured as surface mountable terminals and include a section extending laterally to the exterior through the module housing, which is followed by a section running essentially normal thereto.

18. The arrangement according to claim 15, wherein the module housing is made from an epoxy compound.

19. The arrangement according to claim 15, wherein the module housing is a metal housing.

20. The arrangement according to claim 15, wherein the elastically or plastically deformable means include at least one spring element comprising at least one outwardly arched area on which the printed circuit board is seated, the outwardly arched area being adapted to give way in a spring-like manner under pressure.

21. The arrangement according to claim 20, wherein the spring element is placed in a clamped manner onto the module housing.

22. The arrangement according to claim 20, wherein the spring element comprises clamps adapted to engage the module housing.

23. The arrangement according to claim 20, wherein the spring element is made of metal.

24. The arrangement according to claim 15, wherein the elastically or plastically deformable means comprise at least one elastically or plastically deformable cushion.

25. The arrangement according to claim 24, wherein the at least one elastically or plastically deformable cushion is glued to the outer side of the module housing.

* * * * *